United States Patent [19]

Yamane et al.

[11] Patent Number: 4,845,405
[45] Date of Patent: Jul. 4, 1989

[54] MONOLITHIC LED DISPLAY

[75] Inventors: Mikihito Yamane; Hiroshi Yamane, both of Tottori, Japan

[73] Assignees: Sanyo Electric Co., Ltd.; Tottori Sanyo Electric Co., Ltd., both of Japan

[21] Appl. No.: 48,009

[22] Filed: May 8, 1987

[30] Foreign Application Priority Data

May 14, 1986 [JP] Japan .............................. 61-72108[U]
May 22, 1986 [JP] Japan .............................. 61-77240[U]

[51] Int. Cl.$^4$ ........................................... H01L 33/00
[52] U.S. Cl. ..................................... 313/500; 340/762
[58] Field of Search ............................ 313/500, 499; 315/169.3, 161; 340/782, 762, 766, 718, 719; 357/17

[56] References Cited

U.S. PATENT DOCUMENTS 3,900,864  8/1975  Dapkus et al. .................... 357/17
4,241,281  12/1980  Morimoto et al. ............. 313/500 X

FOREIGN PATENT DOCUMENTS 56796    5/1979  Japan .
136788   7/1985  Japan .

Primary Examiner—Palmer C. DeMeo
Attorney, Agent, or Firm—Darby & Darby

[57] ABSTRACT

According to the present invention, and LED display comprises LED elements in a matrix arrangement of rows and columns on a substrate, only LED elements other than LED elements located in the outermost peripheral rows and columns being utilized to be driven by a driver.

5 Claims, 6 Drawing Sheets

MONOLITHIC LED DISPLAY

BACKGROUND OF THE INVENTION

1. Field of the invention

The present invention relates to an LED (light emitting diode) display having LED elements in a matrix arrangement separated by a plurality of stripes of grooves.

2. Description of the Prior Art

Since in a direct-view display and a projection matrix display, LED elements are arranged close to each other, an LED display of a monolithic type as disclosed in Japanese Patent Laying-Open Gazettes No. 56796/1979 and No. 136788/1985 is preferable to that of a hybrid type.

Referring now to FIGS. 1A and 1B, an LED wafer having a p-n junction 210 is mounted on an insulating substrate 100 of ceramic or the like, a plurality of stripes of grooves 240 and 250 which are deeper than the p-n junction 210 are provided orthogonal to each other from the surface and then, LED elements are connected by thin metal wires 300 in the row (or column) direction. At that time, each of the LED elements separated by the grooves 240 and 250 serves as picture elements 261, 262 and 263.

However, in such a method, the LED elements 261, 262 and 263 are often damaged, because a compound semiconductor which is a material for the LED wafer is brittle. More specifically, undesired cracks are caused and the LED elements are stripped off due to vibration or tortion of a cutting tool such as a dicing blade during formation of the grooves and shocks during wire bonding, as seen in FIG. 1A. The LED elements 261 located in the outermost peripheral rows or columns are damaged more often than the LED elements 263 located in the center. The grooves 240 and 250 are provided after a wafer is mounted on the substrate 100. Since the area occupied by the mounted wafer is large, electrically conductive adhesive 500 is squeezed out and climbs along the side surface of the semiconductor crystal as seen in FIG. 1B. As a result, the p-n junction 210 is liable to be short-circuited.

If the above described defects are caused, an image indicated on the LED display will be imperfect. However, the LED display can not be repaired even if the LED elements located in the outermost peripheral rows or columns are damaged, because each of the LED elements is not of an independent pellet. Therefore, even if one of the LED elements is damaged, the whole matrix is considered as an inferior product, so that the yield thereof is less than 5%.

In such an LED wafer of a matrix type, light from a lighted LED element is reflected by LED elements around the lighted LED element, as shown in FIG. 2. The lighted LED element looks large, while the LED elements located in the outermost peripheral rows or columns look small because the outermost side walls are opened, so that the image quality on the LED display is not high.

When the grooves 250 are formed, a cutting tool such as a dicing blade touches the substrate 100. Therefore, if the substrate 100 is made of a hard material such as ceramic, the LED wafer may be damaged by chippings. In addition, the lifetime of the cutting tool becomes shorter and the blade is liable to be nicked. On the other hand, if the substrate 100 is made of a resin plate or a surface-treated metal plate, the grooves 250 are easily formed. However, the LED generally generates heat as it is lighted. Since in the LED display of a matrix type, the LED elements are arranged close to each other, the heat is concentrated on the substrate 100. Therefore, when the substrate is made of a resin plate, the output of light is decreased and the LED elements may be stripped off because a heat radiation characteristic of the resin plate is bad. On the other hand, when the substrate is made of a metal plate, the LED elements may be stripped off due to the difference in coefficient of thermal expansion between the metal plate and the LED matrix.

SUMMARY OF THE INVENTION

In view of the above described prior art, a primary object of the present invention is to provide a LED display of a matrix type in which LED elements are arranged close to each other, characterized by having no lack of LED elements and good productivity.

In accordance with an aspect of the present invention, an LED display comprises: an insulating substrate; LED elements in a matrix arrangement of rows and columns on the substrate; and leads connected to only elements other than elements located in the outermost peripheral rows and columns for supplying driving current.

In accordance with another aspect of the present invention, an LED display comprises: an insulating substrate; LED elements in a matrix arrangement of rows and columns on the substrate; leads connected to the elements for supplying driving current; and driver means connected to the leads for driving only elements other than elements located in the outermost peripheral rows and columns.

In accordance with still another aspect of the present invention, LED display of a monolithic type comprises: a substrate having striped conductive films separated parallel to each other on the upper surface thereof; LED elements mounted in a matrix arrangement of rows and columns on the substrate by electrically conductive adhesive, the LED elements being separated by forming deeper grooves than a p-n junction in a single semiconductor wafer having the p-n junction parallel to a main surface thereof, the grooves along rows (or columns) extending to the bottom of the wafer and being aligned with a gap between the striped conductive films; metal wires each connecting the LED elements on the upper surface thereof for each column (or row); and driver means connected to the striped conductive films and the metal wires, the driver means being used to drive only elements other than elements located in the outermost peripheral rows and columns.

Accordingly, the LED elements in the outermost peripheral rows and columns of the LED display are not used for indicating images, the whole matrix is not considered as an inferior product and the image quality on the LED display is not affected, even if some of the peripheral LED elements come off and some of the peripheral p-n junctions are short-circuited. Since all the elements used for indicating images are surrounded with the neighboring elements on all sides, lighted picture elements have the same size, so that the image quality on the LED display is rather high.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
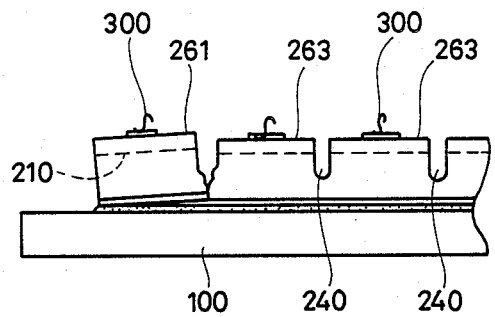
FIGS. 1A and 1B are side elevational views showing a conventional LED matrix.
Figure 1B:
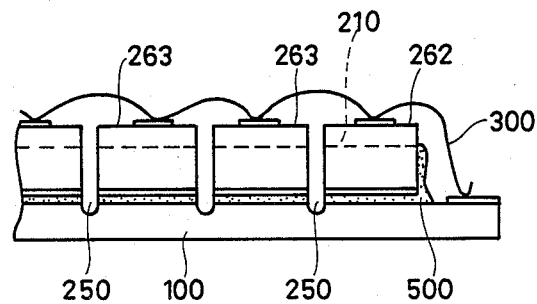
Figure 2:
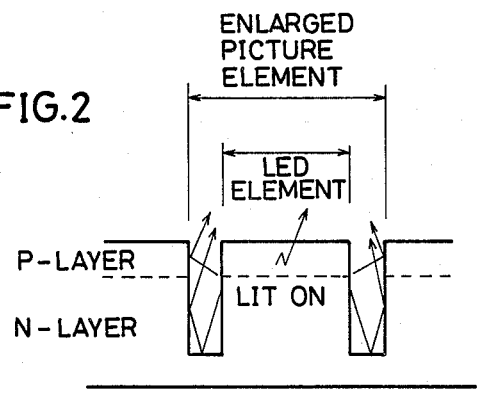
FIG. 2 illustration for explaining a reflection effect of light emitted from a lighted element.
Figure 3:
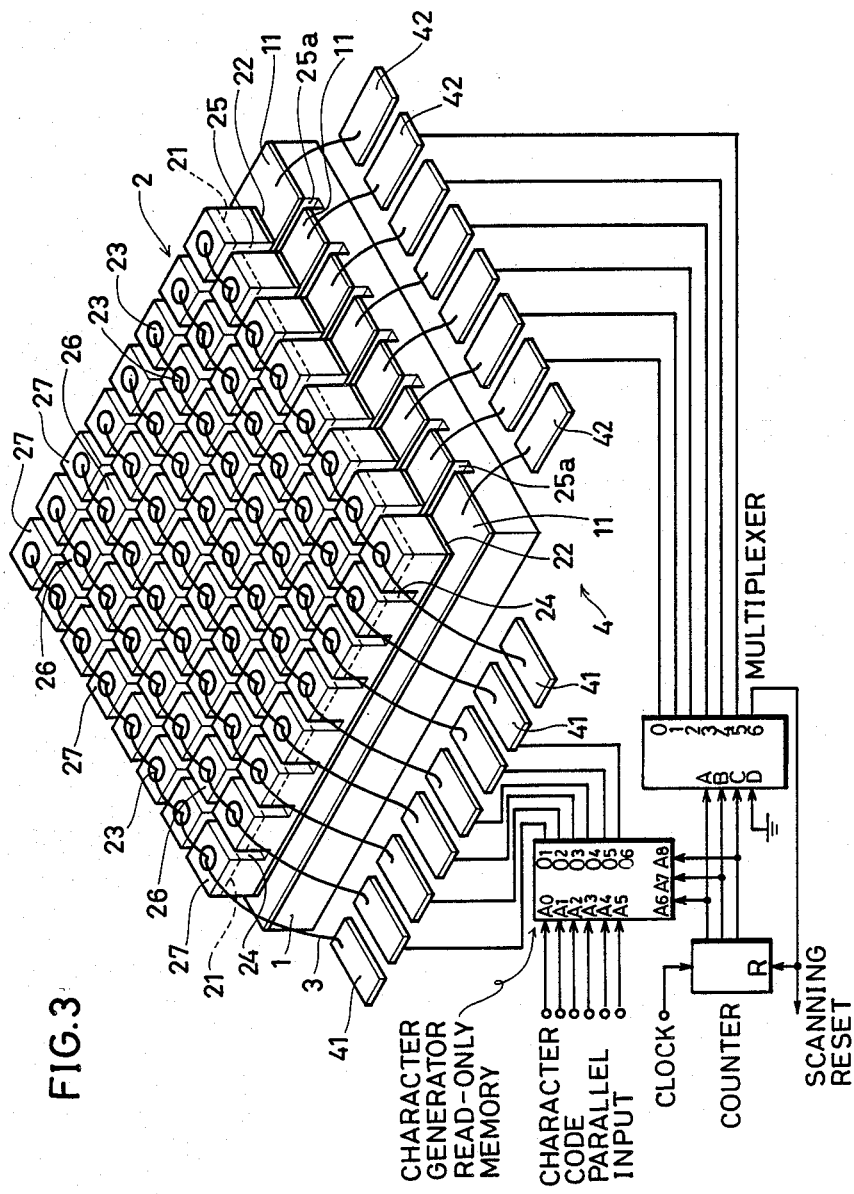
FIG. 3 a perspective view showing an LED display according to embodiment of the present invention.

FIG. 3 is a perspective view showing an LED display of a matrix type according to an embodiment of the present invention, in which a matrix, of effective six rows and six columns is exemplified. A substrate 1 comprises a compound semiconductor such as n-type GaP or n-type GaAs, and is provided with conductive films 11 on the top surface thereof. The substrate 1 should substantially insulate the conductive films 11 from each other. Therefore, if the compound semiconductor substrate 1 is of an n-type, the substrate 1 and the films 11 should not be in an ohmic contact or should form Schottky barrier diodes which are biased reversely.

A secondary square LED wafer 2 is obtained by cutting a primary GaP LED wafer having a p-n junction 21 parallel to a main surface thereof and has electrodes 22 and 23 on the upper and lower surfaces respectively. The LED wafer 2 is provided with deeper grooves 24 and 25 than the p-n junction longitudinally and laterally at regular intervals. As a result, LED elements 26 and 27 each serving as independent picture element and having a square top surface are provided in a matrix arrangement of eight rows and eight columns. The above described grooves 25 are provided to extend to the substrate 1, so that conductive films 11 on the substrate 1 separated by the grooves 25a are in coincidence with the corresponding column electrodes 22 on the lower surface of the LED matrix. Metal wires 3 connect the electrodes 23 on the upper surface to each other in the row direction. The substrate 1 is fixed to a printed circuit board 4, and leads in row and column directions are connected through electrodes 41 and 42 on the printed circuit board 4 respectively to a driver circuit for driving the LED matrix. However, the LED elements 27 located in the outermost peripheral rows and columns (four sides) out of eight rows and eight columns are not driven intentionally by the driver.

Figure 4:
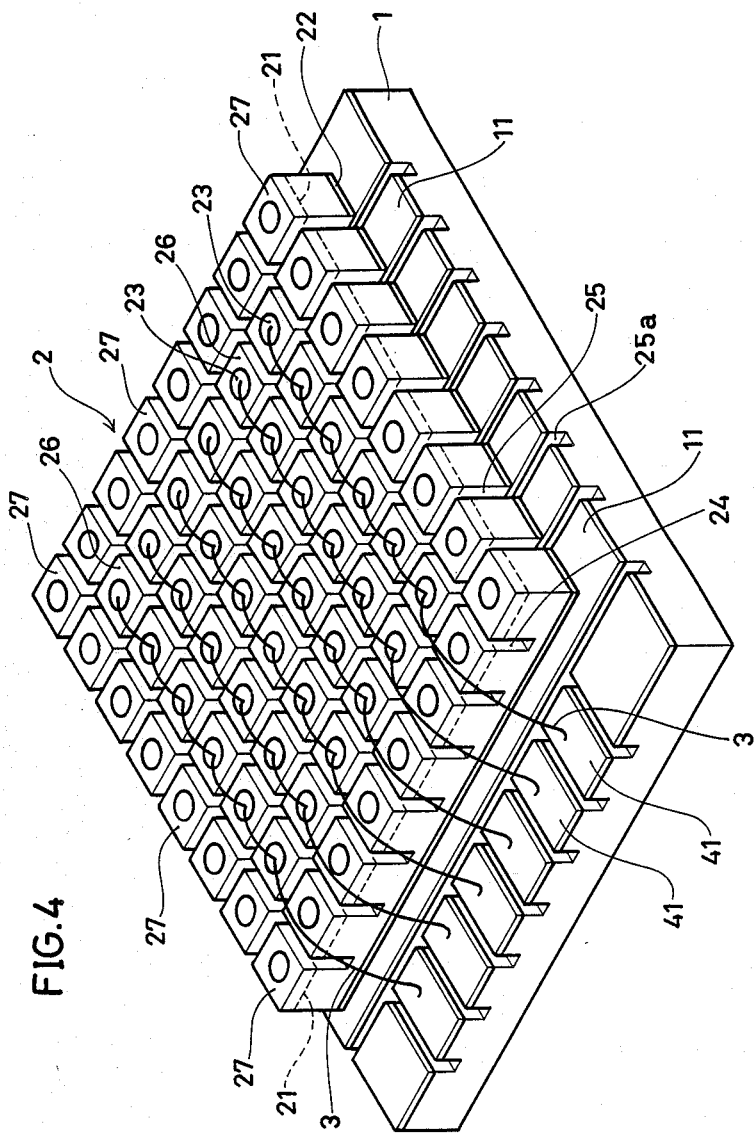
FIG. 4 a perspective view showing an LED display panel according to another embodiment of the present invention.

FIG. 4 is a perspective view showing an LED display panel according to another embodiment of the present invention. The LED elements in the outermost peripheral rows and columns are not provided with leads for supplying driving current.

Figure 5A:
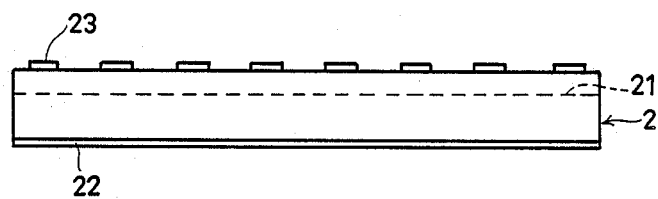
FIGS. 5A, 5B and 5C are illustrations for explaining manufacturing processes of an LED matrix according to an embodiment present invention.
Figure 5B:
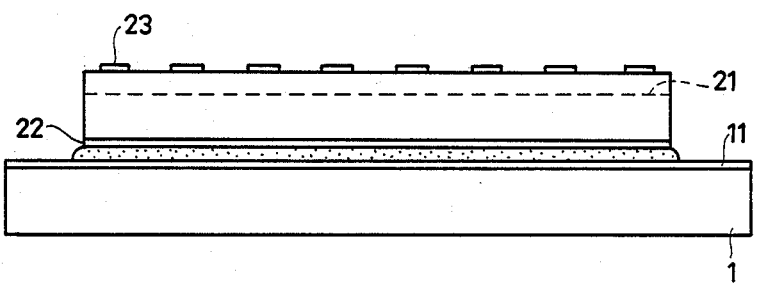

Such an LED display of a matrix type is produced as described below. Referring now to FIG. 5A, a p-n junction 21 is formed by epitaxial growth, the electrodes 22 and 23 are formed by evaporation or the like, and a rectangular LED wafer having a desired size is obtained by cutting a primary wafer. At that time, the thickness of the wafer is, for example, 280 $\mu$m. An electrode 22 covers the entire lower surface of the wafer, while electrodes 23 on the upper surface may be circular electrodes in a matrix arrangement. The LED wafer 2 is fixed onto a metal film 11 of about 1.0 $\mu$m thickness comprising a gold alloy which is provided in advance on the surface of the substrate of an n-type GaP as shown in FIG. 5B, by a conductive adhesive 5 such as a silver loaded epoxy resin. At that time, if the conductive adhesive 5 is small in quantity, bubbles remain in the adhesive, so that adhesive failure occurs. Therefore, the adhesive must be slightly increased in quantity. As a result, the adhesive might be squeezed out around the LED wafer 2. However, the LED elements in the outermost peripheral rows and columns are substantially separated from the LED elements in the center and is not used for indicating images, so that any defect is not caused by the squeezed conductive adhesive 5.

Figure 5C:
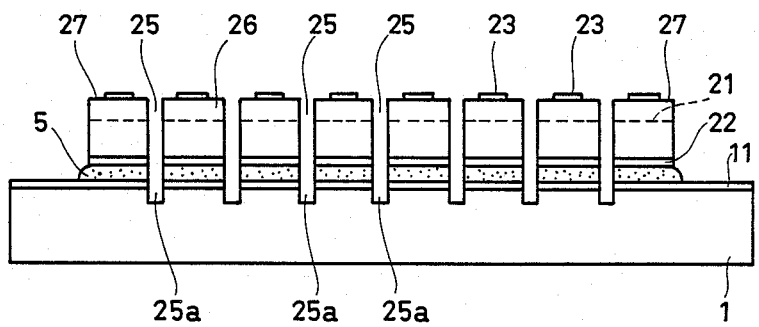
Figure 6:
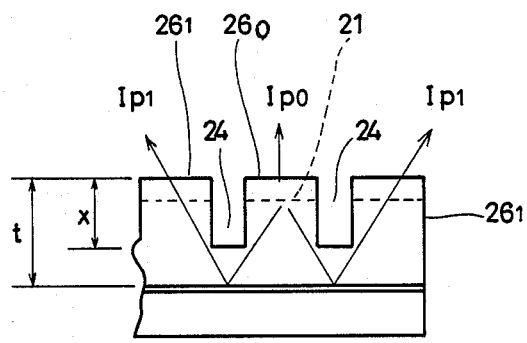
FIG. 6 is an illustration for explaining leakage of light from a lighted element to neighboring elements.
Figure 7:
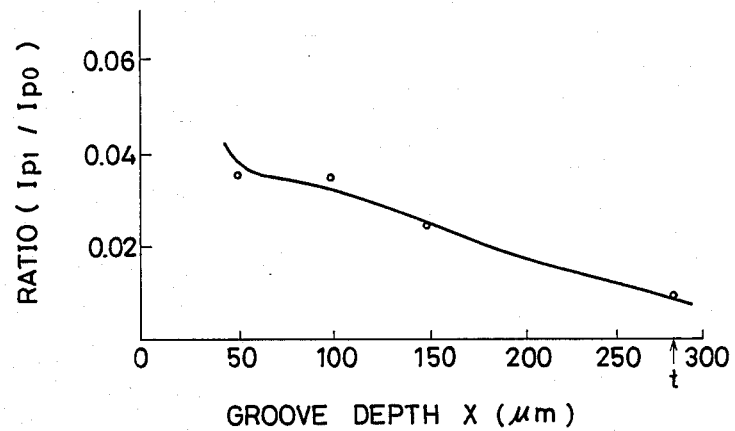
FIG. 7 is a graph showing the relationship between the groove depth and the light leakage.
Figure 8:
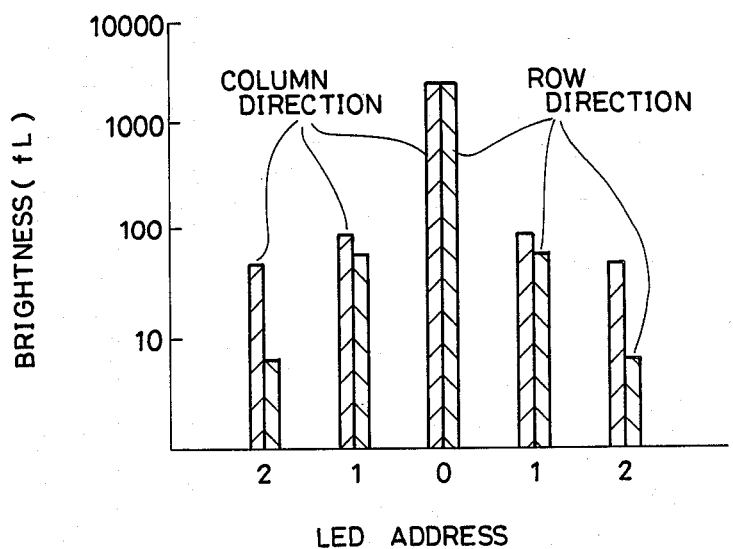
FIG. 8 is a histogram showing the brightness of the light leaked to adjacent LED elements.

Thereafter, the LED wafer 2 is diced from the surface thereof, so that a plurality of stripes of grooves 25 are provided having a pitch of, for example, 0.20 to 0.3 mm, as shown in FIG. 5C. Utilization of a semiconductor for the substrate is also shown in U.S. Pat. No. 4,241,281, but the object of the utilization is different from that of the present invention. According to the present invention, since the substrate is made of a gallium compound, the substrate, together with the LED wafer, can be easily cut by a dicing saw. In addition, chippings do not stick in the substrate, so that a leakage current path is not formed. Further, the grooves 24 orthogonal to the grooves 25 are formed. These grooves 24, 25 usually have a width of about 30-60 $\mu$m. In order not to damage column electrodes, it is necessary that the grooves 24 do not extend to the lower surface of the LED wafer. Therefore, when one LED element $26_0$ is lighted as shown in FIG. 6, light propagates on the bottom surface of the LED wafer, so that light is leaked to adjacent LED elements $26_1$. The light leak ratio ($I_{P1}/I_{P0}$) with respect to the depth X of the grooves 24 in the LED wafer of thickness t was investigated, and the result is shown in FIG. 7. When the depth X of the grooves 24 is larger than half the thickness t of the wafer (X>140 $\mu$m in FIG. 7), the ratio is remarkably decreased. On the other hand, when the relationship between the depth of the grooves 24 and the depth of the p-n junction 21 was investigated, it was found that it is preferable that the depth of the grooves 24 is more than three times that of the p-n junction 21. FIG. 8 is a histogram showing brightness of adjacent LED elements along the shallow grooves 24 (in the column direction) and along the deep grooves 25 (in the row direction) when one of the LED elements (address 0) is lighted under the conditions of a period of 1 msec, a duty of 1/20 and current of 100 mA$_{p-p}$ in the case where the grooves 24 of the LED wafer is 150 $\mu$m in depth.

After the grooves 24 and 25 are provided, chippings are removed by etching, so that the substrate is fixed on the printed circuit board. Although the LED elements are connected by wire bonding with metal wires 3 of gold, gold alloy, aluminum or copper having a diameter of about 20-35 $\mu$m, they may be connected in series for each row by stitch bonding or connected element by element in order by ball bonding. After wiring is completed, the surface of the LED matrix and the thin metal wires may be covered with thin films such as a colorless and transparent resin or a black and transparent silicone resin for protecting the surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An LED display of a monolithic type comprising:
   a substrate having striped conductive films separated parallel to each other on the upper surface thereof,
   a plurality of LED elements formed in a single semiconductor wafer, each element having two opposite conductivity semiconductor materials joined at a junction located at a fixed depth below the uppermost surface of the element, the lowermost surface of each of the elements mounted in a matrix arrangement of row and columns on said conductive films by electrically conductive adhesive, each of said LED elements being isolated by groove along columns (or rows) in the wafer which grooves are a least three times deeper than the junction depth to provide for an LED with enhanced visual characteristics, and grooves along rows (or columns) extending to the bottom of the wafer and being aligned with gaps between the striped conductive films, and conductive wires for connecting said LED elements for each column on the upper surface thereof.

2. An LED display of a monolithic type in accordance with claim 1, wherein said substrate comprises a compound semiconductor, and the striped conductive films are separated from each other simultaneously with formation of the grooves extending to the substrate along rows (or columns).

3. An LED display of a monolithic type in accordance with claim 1, wherein said substrate comprises a compound semiconductor.

4. An LED display of a monolithic type in accordance with claim 3, wherein said substrate and said LED elements comprise a compound semiconductor containing Ga.

5. An LED display of a monolithic type as set forth in claim 7 further comprising two
   driver means connected to said striped conductive films and said metal wires, said driver means being used for driving only elements other than elements located in the outermost peripheral rows and columns.

* * * * *

UNITED STATES PATENT AND TRADEMARK OFFICE
CERTIFICATE OF CORRECTION

PATENT NO. : 4,845,405

DATED : July 4, 1989

INVENTOR(S) : YAMANE ET AL.

It is certified that error appears in the above-identified patent and that said Letters Patent is hereby corrected as shown below:

```
Column 6, line 21, delete "7" and insert --1--.
Column 6, line 21, after comprising delete "two" and insert --:--.
Column 6, line 22, before "driver" insert --two--.
```

Signed and Sealed this

Twenty-first Day of August, 1990

*Attest:*

HARRY F. MANBECK, JR.

*Attesting Officer*     *Commissioner of Patents and Trademarks*